United States Patent
Galasco et al.

(10) Patent No.: US 6,179,990 B1
(45) Date of Patent: Jan. 30, 2001

(54) BIASED ACID CLEANING OF A COPPER-INVAR-COPPER LAMINATE

(75) Inventors: Raymond Thomas Galasco, Vestal; Lawrence Philip Lehman; Roy Harvey Magnuson, both of Endicott; Robert David Topa, Binghamton, all of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/345,305

(22) Filed: Jun. 30, 1999

(51) Int. Cl.$^7$ .................................................. C23F 13/00
(52) U.S. Cl. ...................................... 205/735; 204/196.01
(58) Field of Search .................................. 205/741, 724, 205/735; 204/196.01

(56) References Cited

U.S. PATENT DOCUMENTS

| | | | |
|---|---|---|---|
| 3,632,389 | 1/1972 | Vazirani | 117/49 |
| 3,654,099 | 4/1972 | Bruyne | 204/29 |
| 4,039,410 | 8/1977 | Davidoff | 204/141.5 |
| 4,189,357 | 2/1980 | Riggs, Jr. | 204/29 |
| 4,452,673 | 6/1984 | Takano | 204/29 |
| 4,604,167 | 8/1986 | Wakabayashi et al. | 204/29 |
| 5,538,600 | 7/1996 | Schultz et al. | 428/31 |

OTHER PUBLICATIONS

"Process Considerations in the Fabrication of Teflon Printed Circuit Boards", by Light et al, 1994 Proceedings, 44 Electronic Components & Technology Conference, May 1994.

"High Performance Carrier Technology: Materials And Fabrication", by Light et al, 1993 International Electronics Packaging Conference, San Diego, California, vol. One, pp. 440–456, Sep. 1993.

"High Performance Carrier Technology", by Heck et al, 1993 International Electronics Packaging Conference, San Diego, California, vol. One, pp. 771–779, Sep. 1993.

*Primary Examiner*—Kathryn Gorgos
*Assistant Examiner*—Thomas H Parsons
(74) *Attorney, Agent, or Firm*—Schmeiser, Olsen & Watts; Lawrence R. Fraley

(57) ABSTRACT

A method for cleaning a copper-INVAR-copper laminate in an acid solution without inducing a galvanic etching of the INVAR. An initial step of the method forms a circuit element that includes a power supply, the laminate electrically coupled to a negative terminal of the power supply, and a conductive anode electrically coupled to a positive terminal of the power supply. The conductive anode may include a conductive material, such as titanium, that is preferably inert to an acid solution into which the laminate will be subsequently immersed. After turning on the power supply to a voltage between about 1 volts and about 10 volts, the laminate and conductive anode are immersed in the acid solution, so as to form a closed circuit with a voltage bias across acid copper-INVAR-copper interfaces. The voltage bias prevents galvanic action from occurring and therefore protects against galvanic etching of the INVAR. After the laminate has been cleaned by the acid solution, the laminate is removed from the acid solution and the power supply is turned off. The laminate may also exist as an internal layer of a dielectric substrate, wherein the substrate is immersed in the acid solution, and wherein a through hole passing through the substrate passes through the copper-INVAR-copper laminate.

18 Claims, 6 Drawing Sheets

BIASED ACID CLEANING OF A COPPER-INVAR-COPPER LAMINATE

BACKGROUND OF THE INVENTION

1. Field of the Invention

The present invention relates to a method of cleaning a copper-INVAR-copper laminate in an acid solution without inducing a galvanic etching of the INVAR.

2. Description of the Related Art

A copper-INVAR-copper laminate is commonly included in electronic packages. For example, a copper-INVAR-copper laminate may be present within a dielectric substrate. Exterior surfaces of the substrate may be circuitized such that a plated through hole (PTH) passes through the copper-INVAR-copper laminate and electrically couples the surface circuitizations. Unfortunately, various acid cleaning steps in the formation of the preceding electrical structure may cause undesirable pocket voids to form in the INVAR layer of the copper-INVAR-copper laminate.

After a through hole is formed in the substrate, such as by laser drilling, and prior to a plating of the through hole to complete formation of the PTH, the exposed copper and INVAR surfaces may be pre-cleaned by immersing the substrate in an acid solution. Such acid pre-cleaning removes oxides previously formed on the copper surfaces and cleans the INVAR surface. A suitable acid for this purpose is, inter alia, a mixture of sulfuric acid and phosphoric acid. The copper-INVAR-copper laminate in an acid solution results in formation of a galvanic cell that etches the INVAR but does not etch the copper, thus forming pocket voids within the INVAR. The electrochemistry that selectively forms the pocket voids will be described infra. The pocket voids, if deep enough, may prevent the INVAR from being copper plated in subsequent copper-plating steps. Even if the pocket voids do not impair subsequent copper plating, the structural integrity of the copper plating within the pocket voids will be weak and subject to rupture from thermal or mechanical stresses.

After the acid pre-cleaning, a substrate surface and the through hole are both plated with copper. The copper plating may be accomplished by first forming a thin porous copper layer by electroless plating, or by coating with another type of conductive material such as a conductive graphite or a conductive polymer, followed by forming a relatively thicker layer of copper by electroplating. The electroless plating of copper may be accomplished by any known process such as by first depositing on the surfaces to be plated an adsorbing material, such as a cationic surfactant, which serves as an attractant for the next material to be deposited, namely a seed material such as palladium. Following the palladium seeding, the substrate is electroless plated with copper.

After the electroless plating of copper and before the electroplating of copper, a cleaning step removes oxides from exposed copper surfaces by immersing the substrate in an acid solution such as a sulfuric acid solution. Inasmuch as the thin copper plating in a through hole is porous, acid may migrate through the pores of the thin copper plating and become trapped between the thin copper plating and the INVAR surface covered by the thin copper plating. Subsequent electroplating of copper seals the trapped acid. As with the acid pre-cleaning described supra, the INVAR in contact with the sealed acid is subject to pocket void formation due to galvanic action. The pocket voids resulting from the cleaning step are typically larger and deeper than are the pocket voids resulting from the pre-cleaning step, since the sealed acid will continuously contact the INVAR for an indefinite period of time. Because of the pocket voids, the structural integrity of the copper plating that covers the pocket voids will be weak and subject to rupture from thermal or mechanical stresses.

FIGS. 1–3 illustrates changes in the INVAR layer of a copper-INVAR-copper laminate within a dielectric substrate after the substrate has been immersed in an acid solution. FIG. 1 shows a front cross-sectional view of a substrate 10 having dielectric material 12, wherein the substrate 10 includes an internal copper-INVAR-copper laminate 20. The copper-INVAR-copper laminate 20 includes an INVAR layer 24 sandwiched between a first copper layer 22 and a second copper layer 26. A prior-drilled through hole 28 passes through the copper-INVAR-copper laminate 20 and exposes surface 32 of the first copper layer 22, surface 34 of the first INVAR layer 24, and surface 36 of the second copper layer 26. FIG. 2 shows the substrate 10 immersed in an acid solution 15 for a purpose such as cleaning the surfaces 32, 34, and 36. FIG. 3 illustrates the substrate 10 after the substrate 10 is removed from the acid solution 15. FIG. 3 shows a pocket void 25 in the INVAR layer that resulted from electrochemical etching of the INVAR layer 24 by galvanic action.

The electrochemistry associated with the etching of the INVAR layer 24 is straightforward. While the substrate 10 is immersed in acid solution 15, as shown in FIG. 2, a first galvanic cell is formed from the first copper layer 22, the INVAR layer 24, and the acid solution 15. In the first galvanic cell, hydrogen ions ($H^{3O}$) combine reductively with electrons to form hydrogen gas ($H_2$); i.e.

$$2H^+ + 2e^- \rightarrow H_2 \tag{1}$$

wherein the hydrogen ions for Equation (1) are supplied by the acid solution 15, such as by sulfuric acid ($H_2SO_4$):

$$H_2SO_4 \rightarrow 2H^+ + SO_4^{-2}$$

The electrons ($e^-$) for Equation (1) are generated in the INVAR layer 24 and are transported into the first copper layer 22 due to a difference in potential between the first copper layer 22 and the INVAR layer 24. Finally, the electrons flow along the surface 32 of the first copper layer 22 and into the acid solution 15 where the electrons combine with hydrogen ions to form hydrogen gas. Note that there is no net effect on the first copper layer 22, which explains why the first copper layer 22 is not etched.

Noting that INVAR is a trademark for a ferronickel alloy that includes iron (Fe) and nickel (Ni) with a composition of 63.8% iron, 36% nickel, and 0.2% carbon, the two electrons supplied by the INVAR layer 24 result from an oxidation process that forms ionic species from the iron (e.g, $Fe^{++}$, $Fe^{+++}$) and nickel (e.g, $Ni^{++}$). Applicants have not yet determined the ionic species of iron and nickel, and their relative concentrations, that participate in the ionic chemistry of the INVAR layer 24. Nonetheless, the ionic species actually formed from the iron and nickel dissolve in the acid solution 15 and are thus permanently removed from the INVAR layer 24. The vacating ionic species from the INVAR layer 24 leave an empty space in the INVAR layer 24 so as to form the pocket void 25 shown in FIG. 3. Analogous electrochemical transport processes from a second galvanic cell likewise contribute to the formation of the pocket void 25, wherein the second galvanic cell includes the second copper layer 26, the INVAR layer 24, and the acid solution 15.

As stated supra, the structural integrity of the copper plating that covers a pocket void, and is within a pocket void, is weak and subject to rupture from thermal stresses. Additionally, continuous formation of hydrogen gas from galvanic action of sealed acid within a pocket void develops a gas pressure within the pocket void that may either weaken or rupture the copper plating that covers the pocket void. Thus, a method is needed to prevent pocket void formation in an INVAR layer of a copper-INVAR-copper laminate immersed in an acid solution.

SUMMARY OF THE INVENTION

The present invention provides a method for immersing a copper-ferronickel alloy-copper (CFC) laminate in an acid solution without inducing a galvanic etching of the ferronickel alloy, comprising the steps of:

forming an electrical circuit element, including:
  a power supply;
    the CFC laminate having an ferronickel alloy layer sandwiched between a first copper layer and a second copper layer,
  wherein the CFC laminate is electrically coupled to a negative terminal of the power supply; and
  a conductive anode electrically coupled to a positive terminal of the power supply;
turning on the power supply to a voltage output; and
immersing the CFC laminate and the conductive anode in the acid solution.

The present invention has the advantage of preventing pocket void formation in an a ferronickel alloy layer of a CFC laminate immersed in an acid solution. In doing so, the present invention advantageously preserves the structural integrity of copper plating within a PTH that covers CFC laminate material.

DETAILED DESCRIPTION OF THE INVENTION

Figure 4:
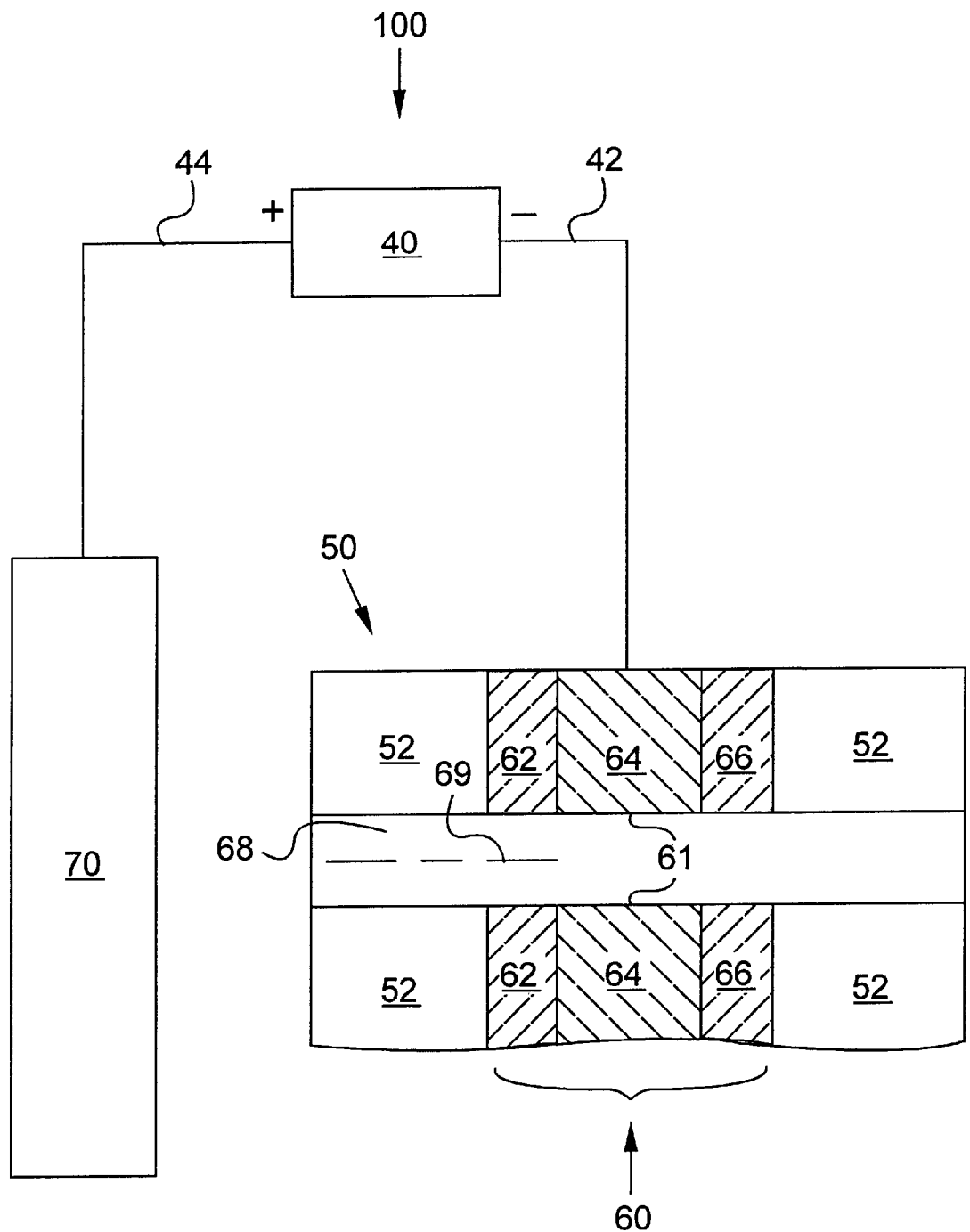
FIG. 4 depicts a front cross-sectional view of a circuit element having a substrate and a conductive anode, in accordance with the preferred embodiment of the present invention.

FIG. 4 illustrates a front cross-sectional view of a circuit element, in accordance with the preferred embodiment of the present invention. FIG. 4 show a circuit element 100 comprising a power supply 40, a substrate 50, and a conductive anode 70. The conductive anode 70 is electrically coupled to a positive end of the power supply 40 by use of an electrical coupler 44 such as a cable. The substrate 50 is electrically coupled to a negative end of the power supply 40 by use of an electrical coupler 42 such as a cable. The substrate 50 includes dielectric material 52, an internal copper-ferronickel-alloy copper (CFC) laminate 60, and a through hole 68 that passes through the CFC laminate 60. The CIC laminate 60 includes an INVAR layer 64 sandwiched between a first copper layer 62 and a second copper layer 66. A planar cross-section of the through hole 68, perpendicular to the axis 69 of the through hole 68, may have any planar shape such as that of a circle, ellipse, square, etc. While FIG. 4 shows the electrical coupler 42 directly coupled to the CFC laminate 60 at the INVAR layer 64, the electrical coupler 42 may alternatively be directly coupled to either the first copper layer 62 or the second copper layer 66. The conductive anode 70 may be a plate, a screen, or have any other geometrical shape. The conductive anode 70 preferably includes any conductive material, such as titanium or platinized titanium (i.e., titanium plated with platinum), that is inert to an acid solution that the conductive anode 70 will subsequently be in contact with. The conductive anode 70 may alternatively include a conductive material that is not inert to the acid solution, under condition to be discussed infra.

Figure 5:
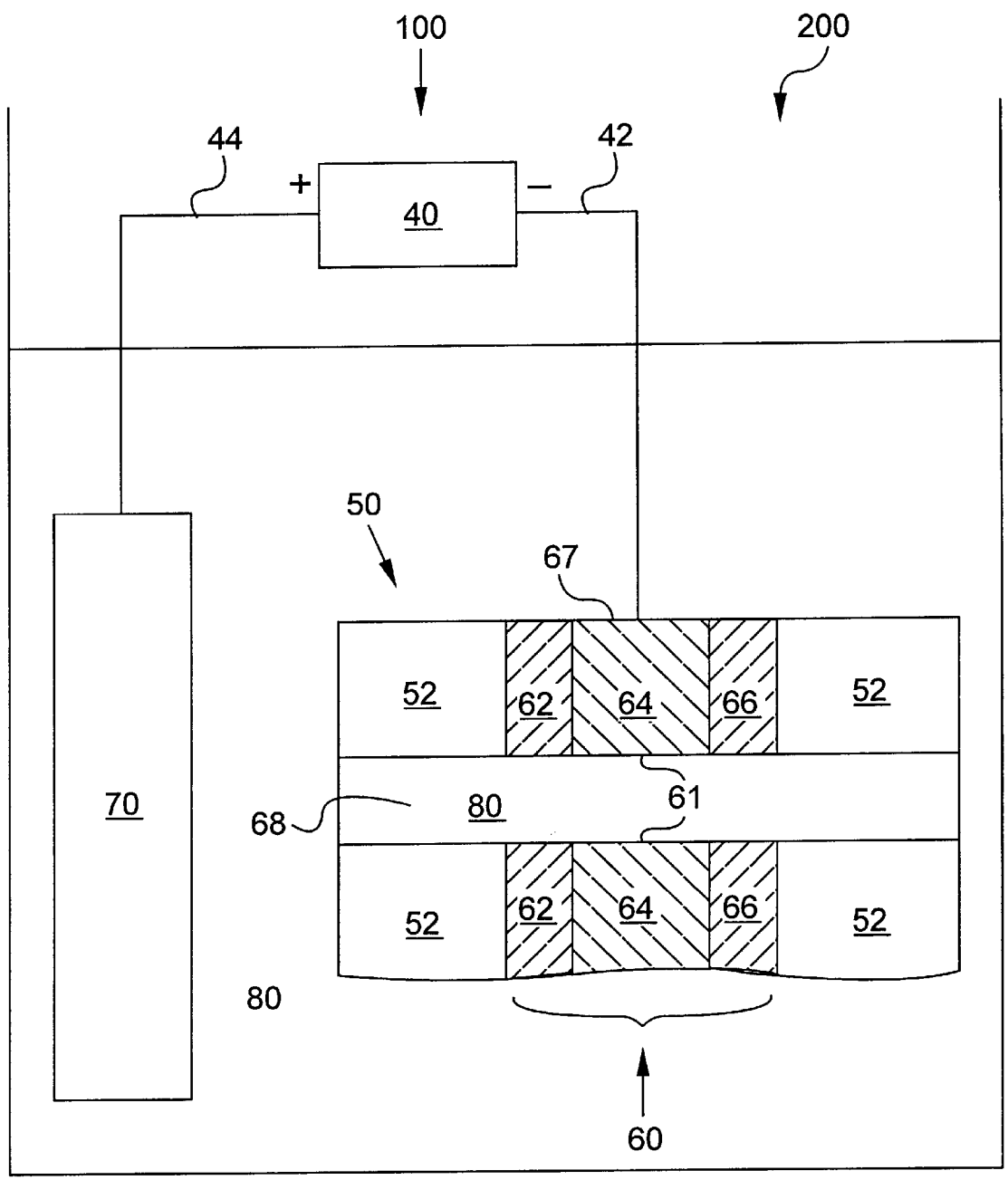
FIG. 5 depicts FIG. 4 with the substrate and the conductive anode immersed in an acid solution.

The power supply 40 is turned on to a voltage output preferably between about 1 volts and about 10 volts, and preferably prior to the subsequent step of immersion of the substrate 50 and the conductive anode 70 in an acid solution. If the power supply 40 is turned on after immersion, the power supply 40 should be turned on as soon as possible after immersion in order to minimize galvanic etching of the INVAR layer 64. FIG. 5 illustrates FIG. 4 after the substrate 50 and the conductive anode 70 have been immersed in an acid solution 80. The acid solution 80 may serve a purpose of, inter alia, cleaning exposed copper surfaces on the first copper layer 62, on the second copper layer 66, and elsewhere on the substrate 50. The acid solution 80 may include any inorganic acid, such as sulfuric acid, hydrochloric acid, or a mixture of sulfuric acid and phosphoric acid. If the substrate 50 and the conductive anode 70 make a "live entry" into the acid solution 80 (i.e., the power supply 40 is turned on prior to immersion), an electrical circuit structure 200 is immediately formed upon immersion of the substrate 50 and the conductive anode 70 into the acid solution 80. The electrical circuit structure 200 includes a voltage bias across an acid-CFC interface 61 within the through hole 68, as well as a voltage bias across an acid-CFC interface 67 at an external surface of the substrate 50.

The voltage bias across the acid-CFC interfaces 61 and 67 is typically between tens of millivolts to several hundred millivolts such that the voltage in the INVAR layer 64 is more negative than the voltage in the acid solution 80. This voltage bias prevents galvanic formation of pocket voids in the INVAR layer 64 as will be explained infra. Without the voltage bias, the acid solution 80 and the CFC laminate 60 would form a galvanic cell that would etch pocket voids into the INVAR layer 64, as explained supra in the Related Arts section. The voltage bias inhibits oxidation of the INVAR layer 64, which prevents material of the INVAR layer 64 from dissolving in the acid solution 80. As a result, the entire CFC laminate 60 acts as a reduction layer that generates hydrogen gas in accordance with Equation (1). Without the bias voltage of the present invention, the aforementioned source of electrons is the INVAR layer 64 with consequent pocket void formation in the INVAR layer 64 due to an oxidation and dissolving of INVAR material in the acid solution 80. With the present invention, however, the voltage bias across the acid-CFC interfaces 61 and 67 inhibits oxidation of the INVAR layer 64, thereby preventing pocket void formation in the INVAR layer 64.

The aforementioned source of electrons with the present invention is water near the conductive anode 70 and ionization thereof. The voltage from the power supply 40 ionizes water in the vicinity of the conductive anode 70 according to:

$$2H_2O \rightarrow 4H^+ + O_2 + 4e^- \quad (2)$$

The electrons generated according to Equation (2) travel through the conductive anode 70, the electrical coupler 44, the power supply 40, the electrical coupler 42, and finally into the CFC laminate 60. In that manner, electrons are supplied to the first copper layer 62, the INVAR layer 64, and the second copper layer 66 to reductively generate hydrogen gas in accordance with Equation (1). Thus, in the present invention, the bias voltage in combination with the conductive anode 70 prevents pocket void formation in the INVAR layer 64.

After accomplishment of the purpose(s) for which the substrate 50 had been immersed in the acid solution 80 (e.g., cleaning of exposed copper surfaces on the substrate 50), the substrate 50 is removed from the acid solution 80, preferably with a "live exit" (i.e., with the power remaining on) to prevent galvanic etching of the INVAR layer 64. With a "live exit," the power supply 40 is turned off after the substrate 50 is removed from the acid solution 80. If the power supply 40 is turned off before removal of the substrate 50, the power supply 40 should be turned off close as possible to the time of removal of the substrate 50 in order to minimize galvanic etching of the INVAR layer 64.

As stated previously, it is preferred that the conductive anode 70 be inert to the acid solution 80. Nonetheless, it is within the scope of the present invention for the conductive anode 70 to include a material that dissolves in the acid solution 80 at a sufficiently low rate that the conductive anode 70 has enough remaining structure to operate as intended at the time that the substrate 50 is removed from the acid solution 80. A suitable conductive anode material of this type is, inter alia, copper. Note that suitability of the conductive anode 70 may also be influenced by the mass of the conductive anode 70. For example, a conductive anode 70 that dissolves in the acid solution 80 at a high rate may nevertheless be effective for the present invention if its mass and mass distribution is sufficiently large that the conductive anode 70 has enough remaining structure to operate as intended at the time the substrate 50 is removed from the acid solution 80.

While FIG. 5 shows the through hole 68 and associated acid-CFC interface 61, the present invention includes CFC laminates not having a through hole. For example, if the through hole 68 in FIG. 5 were absent, the present invention would be nevertheless be directed to the acid-CFC interface 67 that relates to an exterior surface of the substrate 50.

Figure 1:
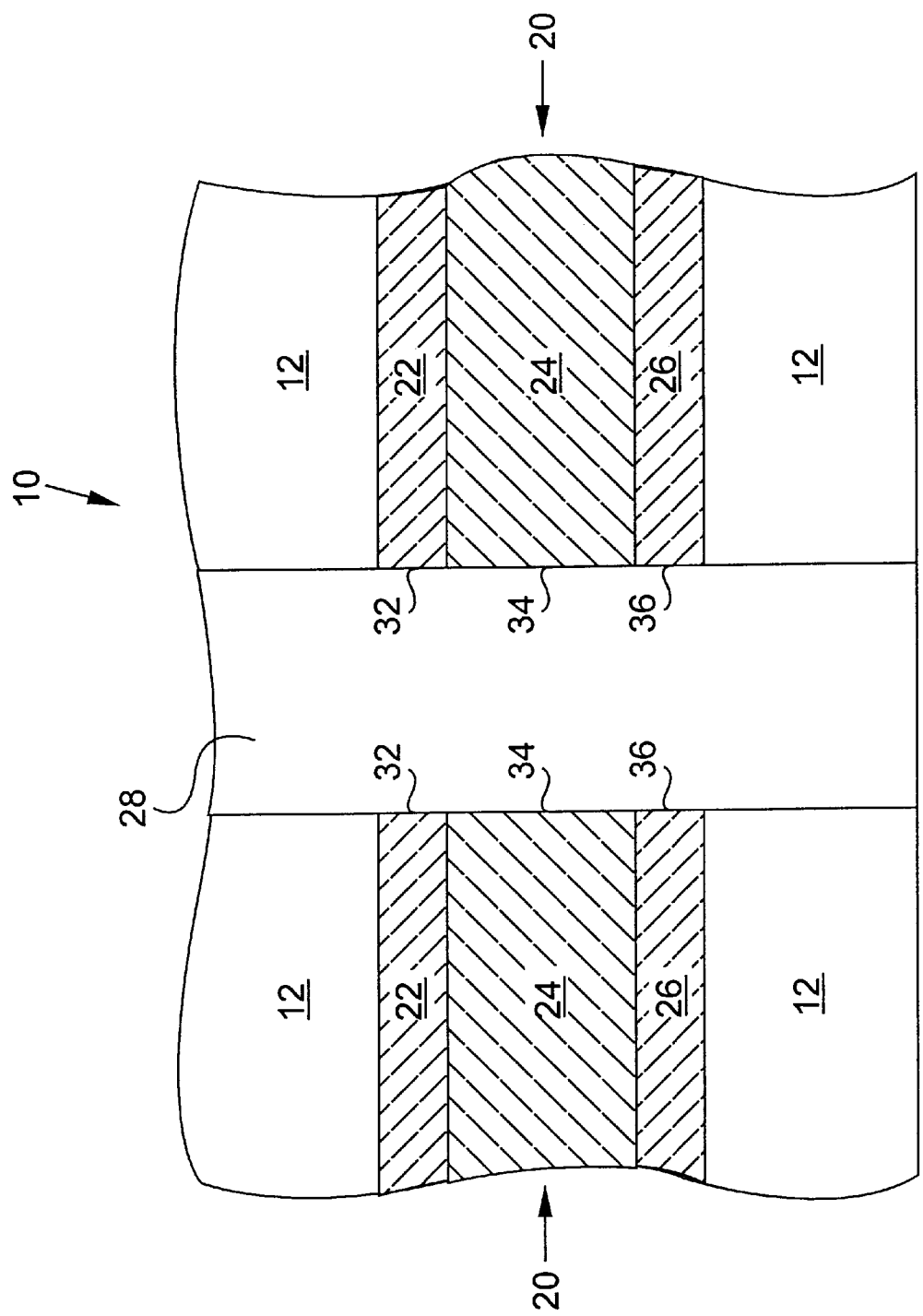
FIG. 1 depicts a prior art front cross-sectional view of a substrate including a through hole passing through a copper-INVAR-copper (CFC) laminate.
Figure 2:
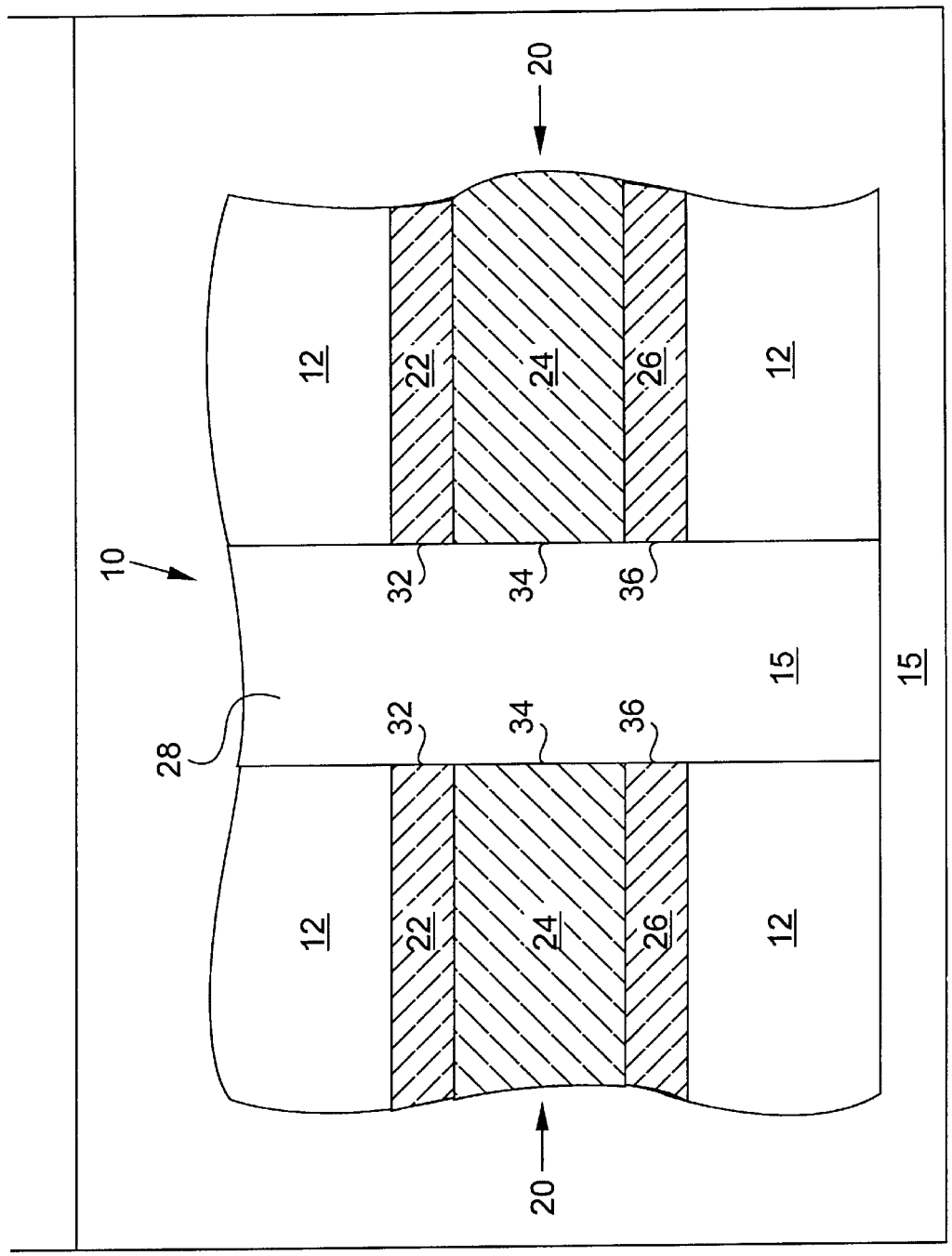
FIG. 2 depicts FIG. 1 with the substrate immersed in an acid solution.
Figure 3:
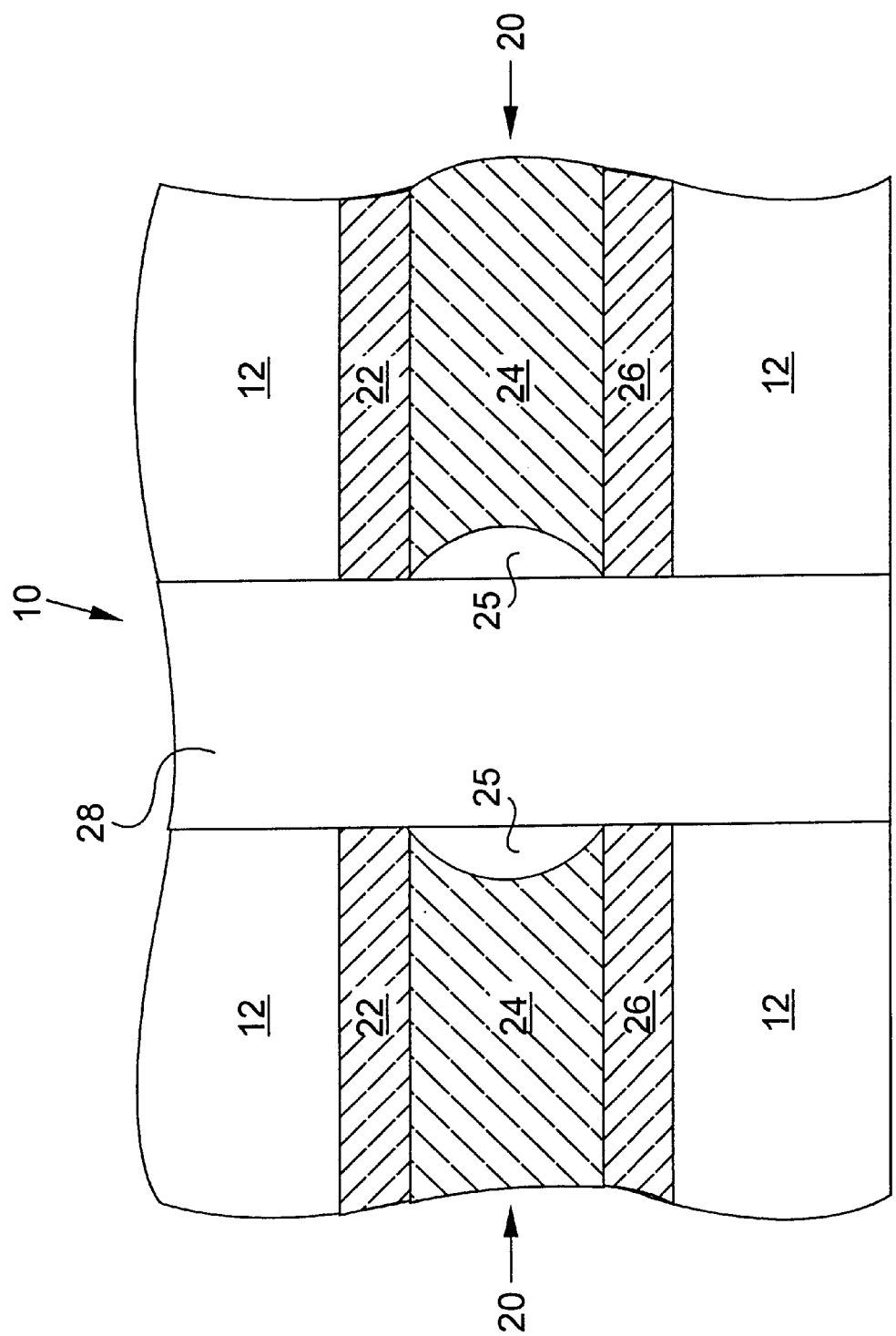
FIG. 3 depicts FIG. 2 after the substrate has been removed from the acid solution.
Figure 6:
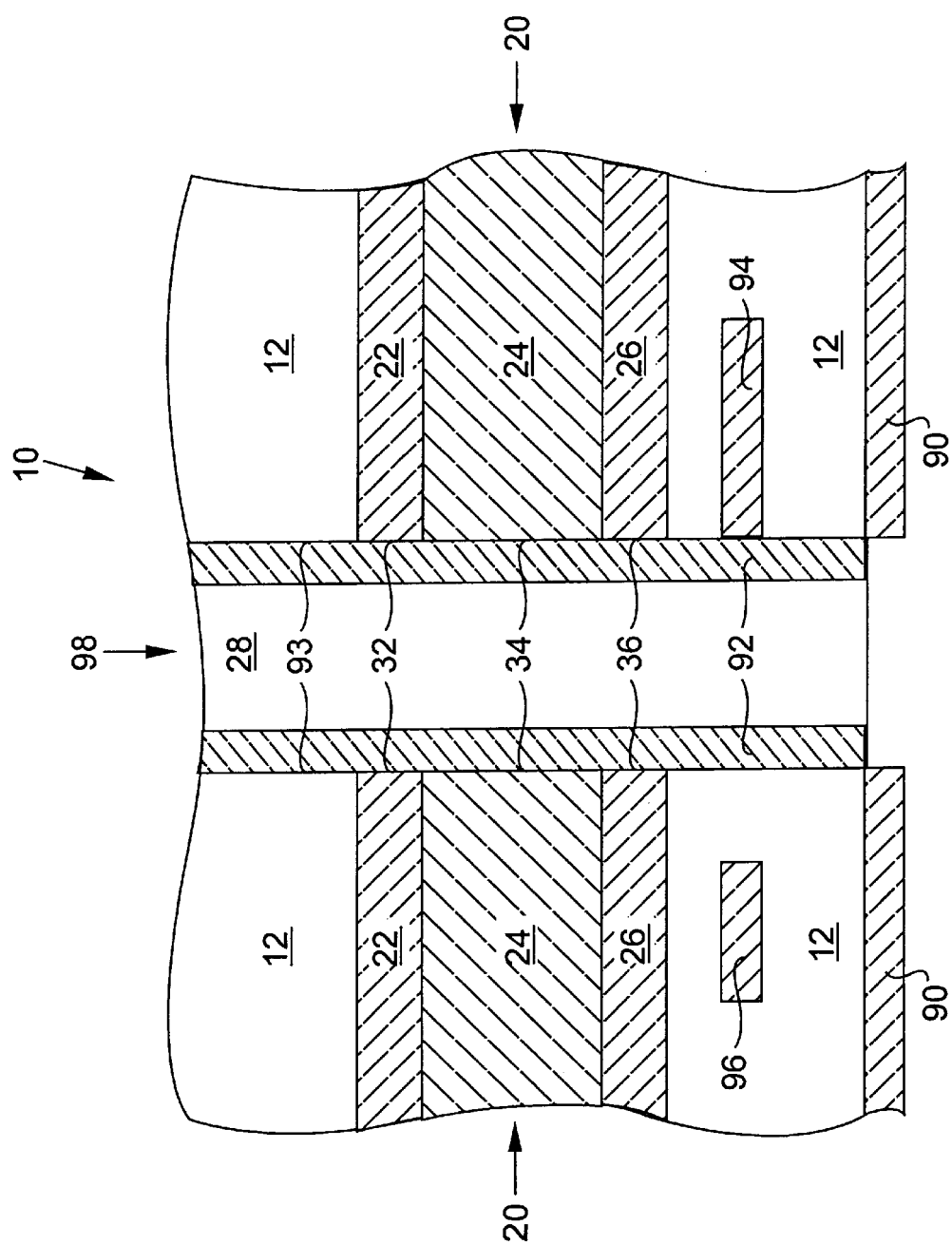
FIG. 6 depicts how FIG. 3 would appear if the substrate were processed in accordance with the preferred embodiment of the present invention.

As shown and described in relation to FIGS. 4 and 5, the present invention enables the CFC laminate 60 to be cleaned in an acid solution without formation of pocket voids in the INVAR layer 64 of the CFC laminate 60. Thus if the substrate of FIGS. 1–3 were processed in accordance with the present invention, the INVAR layer 24 of the CFC laminate 20 in FIG. 3 would appear as represented in FIG. 6. It is to be particularly noted that the pocket void 25 in FIG. 3 does not appear in FIG. 6, because the bias voltage of the present invention prevents oxidation of the INVAR layer 24 of the CFC laminate 20. FIG. 6 also illustrates additional structure, including a copper plating 92 on a surface 93 of the through hole 28 to form a PTH 98, a surface layer of copper 90 conductively coupled to the copper plating 92, an internal copper plane 94 conductively coupled to the copper plating 92, and an internal copper plane 96.

Although the process of the present invention was described supra for preventing formation of pocket voids in a CFC laminate that has been immersed in an acid solution, the process is also applicable to relevant structures other than CFC laminates.

One such relevant structure within the scope of the present invention includes a iron-nickel-alloy (i.e., an alloy that includes nickel and iron) conductively coupled to a metal that is more noble than the iron-nickel-alloy. An example of an iron-nickel-alloy is INVAR. Applicable more-noble metals include copper, gold, and palladium. The conductive coupling may include, inter alia, direct conductive contact as well as by indirect conductive interfacing. An example of indirect conductive interfacing is a PTH that conductively couples an INVAR layer to a copper layer, wherein the INVAR layer is spatially separated from the copper layer. Pocket voids may form in the iron-nickel-alloy from galvanic action caused by immersion of the aforementioned relevant structure in an acid solution. Such pocket void formation may be prevented by application of a negative voltage to the iron-nickel-alloy and a positive voltage to a conductive anode. Indeed, a special case of the aforementioned relevant structure is a copper-INVAR laminate for which the process of the present invention was specifically described supra. Accordingly, the aforementioned relevant structure may substitute for the CFC laminate 60 in FIGS. 4–5.

Another such relevant structure within the scope of the present invention includes a iron-nickel-alloy such an INVAR. Noting that pocket voids may potentially form in an iron-nickel-alloy by chemical etching rather than galvanic action, such pockets voids may nevertheless be prevented by application of a negative voltage to the iron-nickel-alloy and a positive voltage to a conductive anode. The resulting voltage bias causes the iron-nickel-alloy to become a reducing agent on which hydrogen gas is generated. Thus, the iron-nickel-alloy responds to the applied voltage in the same manner as does the INVAR layer of a CFC laminate. Accordingly, an iron-nickel-alloy may substitute for the CFC laminate 60 in FIGS. 4–5.

While preferred and particular embodiments of the present invention have been described here for purposes of illustration, many modifications and changes will become apparent to those skilled in the art. Accordingly, the appended claims are intended to encompass all such modifications and changes as fall within the true spirit and scope of this invention.

We claim:

1. A method for immersing a copper-ferronickel alloy-copper (CFC) laminate in an acid solution without inducing a galvanic etching of the ferronickel alloy, comprising the steps of:

forming an electrical circuit element including:
      a power supply;
      the CFC laminate having a ferronickel alloy layer sandwiched between a first copper layer and a second copper layer, wherein the CFC laminate is electrically coupled to a negative terminal of the power supply; and
      a conductive anode electrically coupled to a positive terminal of the power supply;
   turning on the power supply to a voltage output; and
   immersing the CFC laminate and the conductive anode in the acid solution.

2. The method of claim 1, wherein the voltage output is between about 1 volts and about 10 volts.

3. The method of claim 1, wherein the CFC laminate includes a through hole passing through a thickness of the CFC laminate.

4. The method of claim 1, wherein the CFC laminate further comprises:
   a first dielectric layer bonded to the first copper layer; and
   a second dielectric layer bonded to the second copper layer.

5. The method of claim 1, wherein the acid solution includes an acid selected from the group consisting of sulfuric acid, sulfuric acid and phosphoric acid, and hydrochloric acid.

6. The method of claim 1, wherein the acid solution includes sulfuric acid and phosphoric acid.

7. The method of claim 1, wherein the conductive anode is inert to the acid solution.

8. The method of claim 1, wherein the conductive anode includes titanium.

9. An electrical circuit structure, comprising:
   an electrical circuit element, including:
      a power supply for generating a voltage output;
      a copper-ferronickel-alloy (CFC) laminate having an INVAR layer sandwiched between a first copper layer and a second copper layer, wherein the CFC laminate is electrically coupled to a negative terminal of the power supply; and
      a conductive anode electrically coupled to a positive terminal of the power supply; and
   an acid solution, wherein the CFC laminate and the conductive anode are immersed in the acid solution.

10. The electrical circuit structure of claim 9, wherein the voltage output is between about 1 volts and about 10 volts.

11. The electrical circuit structure of claim 9, wherein the CFC laminate includes a through hole passing through a thickness of the CFC laminate.

12. The electrical circuit structure of claim 9, wherein the CFC laminate further comprises:
   a first dielectric layer bonded to the first copper layer; and
   a second dielectric layer bonded to the second copper layer.

13. The electrical circuit structure of claim 9, wherein the acid solution includes sulfuric acid.

14. The electrical circuit structure of claim 9, wherein the acid solution includes sulfuric acid and phosphoric acid.

15. The electrical circuit structure of claim 9, wherein the conductive anode is inert to the acid solution.

16. The electrical circuit structure of claim 9, wherein the conductive anode includes titanium.

17. A method for immersing a metal structure in an acid solution without forming a pocket void in the metal structure, comprising the steps of:
   selecting the metal structure from the group consisting of an iron-nickel alloy and a noble metal structure, wherein the noble metal structure includes a second iron-nickel alloy conductively coupled to a metal that is more noble than the second iron-nickel alloy;
   forming an electrical circuit element including:
      a power supply;
      the metal structure electrically coupled to a negative terminal of the power supply; and
      a conductive anode electrically coupled to a positive terminal of the power supply;
   turning on the power supply to a voltage output; and
   immersing the metal structure and the conductive anode in the acid solution.

18. An electrical circuit structure, comprising:
   an electrical circuit element, including:
      a power supply for generating a voltage output;
      a metal structure electrically coupled to a negative terminal of the power supply, wherein the metal structure is selected from the group consisting of an iron-nickel alloy and a noble metal structure, wherein the noble metal structure includes a second iron-nickel alloy conductively coupled to a metal that is more noble than the second iron-nickel alloy; and
      a conductive anode electrically coupled to a positive terminal of the power supply; and
   an acid solution, wherein the metal structure and the conductive anode are immersed in the acid solution.

* * * * *